United States Patent
Lim et al.

(10) Patent No.: US 7,582,568 B2
(45) Date of Patent: Sep. 1, 2009

(54) METHOD OF FORMING A PHASE CHANGEABLE STRUCTURE

(75) Inventors: Young-Soo Lim, Chungcheongbuk-do (KR); Jun-Soo Bae, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 3 days.

(21) Appl. No.: 11/625,142

(22) Filed: Jan. 19, 2007

(65) Prior Publication Data

US 2007/0224796 A1    Sep. 27, 2007

(30) Foreign Application Priority Data

Jan. 20, 2006  (KR) ............... 10-2006-0006057
Jan. 17, 2007  (KR) ............... 10-2007-0005007

(51) Int. Cl.
    *H01L 21/302*    (2006.01)
(52) U.S. Cl. ............... 438/714; 438/95; 257/E21.305
(58) Field of Classification Search ......... 438/738, 438/714, 95, 689, 102; 257/E21.305
    See application file for complete search history.

(56) References Cited

U.S. PATENT DOCUMENTS

| 6,831,019 | B1 | 12/2004 | Li et al. |
| 6,964,928 | B2 * | 11/2005 | Ying et al. ............... 738/706 |
| 2005/0032374 | A1 | 2/2005 | Spandre |
| 2007/0154847 | A1 * | 7/2007 | Chen et al. ............... 430/313 |

FOREIGN PATENT DOCUMENTS

| KR | 2002-53436 | 7/2002 |
| KR | 10-2005-0053255 | 6/2005 |

* cited by examiner

*Primary Examiner*—Asok K Sarkar
*Assistant Examiner*—Julia Slutsker
(74) *Attorney, Agent, or Firm*—Marger Johnson & McCollom, P.C.

(57) ABSTRACT

The present invention relates to a method of forming a phase changeable structure wherein an upper electrode is formed on a phase changeable layer. A material including fluorine can be provided to the phase changeable layer and the upper electrode. The phase changeable layer can be etched to form a phase changeable pattern. Oxygen plasma or water vapor plasma can then be provided to the upper electrode and the phase changeable pattern.

12 Claims, 4 Drawing Sheets

METHOD OF FORMING A PHASE CHANGEABLE STRUCTURE

CROSS-REFERENCE TO RELATED APPLICATION

This application claims the benefit of Korean Patent Application Nos. 10-2006-0006057 filed on Jan. 20, 2006, and 10-2007-0005007 filed on Jan. 17, 2007, the disclosures of which are incorporated herein by reference in their entireties.

FIELD OF THE INVENTION

The present invention relates to a method of forming a structure in a memory cell. More particularly, the present invention relates to a method of forming a phase changeable structure in a memory cell.

BACKGROUND OF THE INVENTION

Nonvolatile memory devices have garnered much interest in recent times, including nonvolatile memory devices made of a phase changeable structure. Referencing FIG. 1, a phase changeable structure typically includes a lower electrode 200, a phase changeable pattern 310 and an upper electrode 410. A phase changeable pattern can be obtained from etching a phase changeable layer using a mask pattern. The phase changeable pattern is typically situated between the lower electrode and the upper electrode and can include a calcogenide.

Typically, a predetermined amount of current (e.g., generated by a difference in voltage between the lower electrode and the upper electrode) can be applied to the phase changeable pattern to induce a change in phase from a single crystalline state having a relatively low electric resistance into an amorphous state having a relatively high electric resistance. In addition, when the current applied to the phase changeable pattern is reduced or removed, the phase changeable pattern may be changed from the amorphous state into the single crystalline state.

In accordance with a conventional method of forming a phase changeable structure, a phase changeable layer is formed on a lower electrode. A metal nitride layer is then formed on the phase changeable layer. Thereafter, a first etching process is performed on the metal nitride layer to form an upper electrode 410 on the phase changeable layer, as illustrated in FIG. 1. A second etching process is then performed on the phase changeable layer to form a phase changeable pattern 310, as illustrated in FIG. 1.

When either or both of the first etching process or the second etching process is performed using a chlorine-containing etching material, a commonly used etchant, a significant amount of defects were detected in the phase changeable pattern. It is believed that chlorine may reside on a side face of the phase changeable pattern or at an interface between the phase changeable pattern and the upper electrode. It is also believed that this remaining chlorine residue or a byproduct thereof may contribute to defect formation, such as via erosion, in succeeding processes. An illustration of the typical defects that can be formed is illustrated in FIG. 1. Defects can occur between the phase changeable pattern 310 and the top electrode 410 as illustrated by reference number 302 in either or both portions of the phase changeable structure. Defects can also occur on a side face of the phase changeable pattern 310, as illustrated by reference numbers 304 and 306. Defects can also occur between phase changeable pattern 310 and the insulating layer, as illustrated by reference number 306. When such defects occur, erratic and discontinuous resistance to current behavior can be exhibited, as illustrated in FIG. 2.

SUMMARY OF THE INVENTION

The present invention provides a method of forming a phase changeable structure including a phase changeable pattern having a reduction in defects.

In accordance with a first embodiment of the present invention, a phase changeable layer is formed on a lower electrode. A conductive layer is then formed on the phase changeable layer. The conductive layer and at least a portion of the phase changeable layer are then etched by using a first material including a chlorine-containing compound and a fluorine-containing compound to form an upper electrode and at least a portion of a phase changeable pattern, respectively. The upper electrode and the phase changeable pattern are then exposed to a second material having an oxygen-containing compound.

In accordance with a second embodiment of the present invention, a phase changeable layer is formed on a lower electrode. A conductive layer including metal is then formed on the phase changeable layer. At least a portion of the conductive layer is etched by using a first material having a chlorine-containing compound to form an upper electrode. The upper electrode and the phase changeable layer are then exposed to a second material having a fluorine-containing compound. The phase changeable layer is then etched by using a third material that is substantially free of chlorine to form a phase changeable pattern.

BRIEF DESCRIPTION OF THE DRAWINGS

The above and other advantages of the present invention will become readily apparent by reference to the following detailed description when considered in conjunction with the accompanying drawings in which.

DESCRIPTION OF THE EMBODIMENTS

Figure 1:
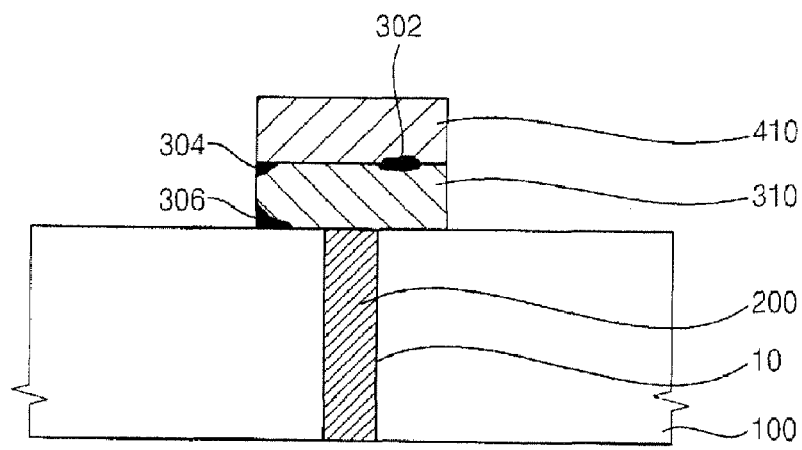
FIG. 1 is a cross-sectional view illustrating a phase changeable structure having typical defects.
Figure 2:
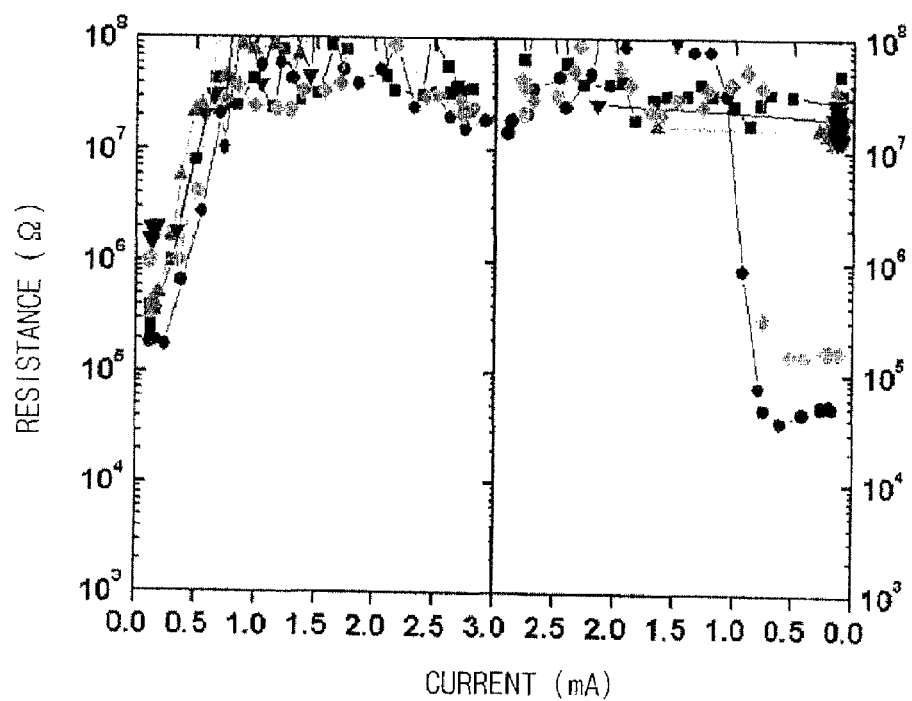
FIG. 2 is a graph showing electric resistance in relation to current of a phase changeable structure containing the typical defects illustrated in FIG. 1.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the relative sizes of layers and regions may be exaggerated for clarity. The drawings are not to scale. Unless otherwise indicated, like reference numerals designate like elements throughout the drawings.

It will also be understood that when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present. As used herein, the term "and/or" may include any and all combinations of one or more of the associated listed items.

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Embodiments of the present invention are described with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the present invention.

Embodiment 1

Figure 3:
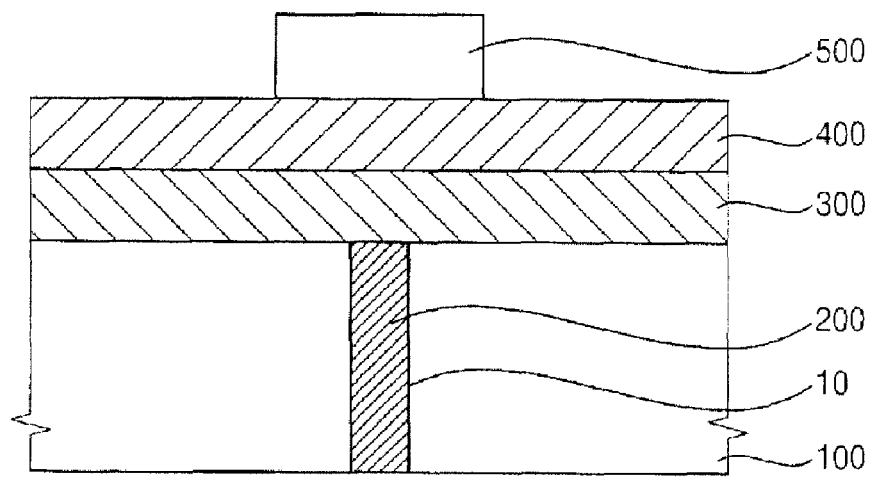
FIGS. 3 and 4 are cross-sectional views illustrating a method of forming a phase changeable structure in accordance with a first embodiment of the present invention.
Figure 4:
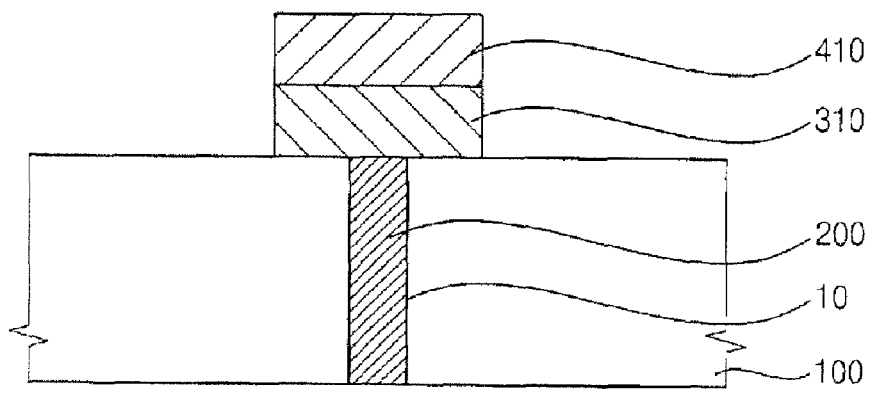

FIGS. 3 and 4 are cross-sectional views illustrating a method of forming a phase changeable structure in accordance with a first embodiment of the present invention.

Referring to FIG. 3, an insulating layer 100 having a hole 10 is formed. The insulating layer 100 may be formed using oxide or nitride. For example, the insulating layer 100 may be formed using phosphor silicate glass (PSG), boro-phosphor silicate glass (BPSG), undoped silicate glass (USG), spin on glass (SOG), tetra ethyl ortho silicate (TEOS), plasma enhanced-TEOS (PE-TEOS), flowable oxide (FOX), high density plasma-chemical vapor deposition (HDP-CVD) oxide or silicon nitride.

A lower electrode 200 is formed in the hole 10. The lower electrode 200 may be formed using metal, metal nitride or combination thereof. For example, the lower electrode 200 may be formed using tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, copper, aluminum copper, alloys thereof, or any combination thereof. Alternatively, the lower electrode may include polysilicon doped with impurities. An upper face of the insulating layer 100 may be substantially coplanar with an upper face of the lower electrode 200.

A phase changeable layer 300 is then formed on the insulating layer 100 and the lower electrode 200. The phase changeable layer 300 may include calcogenide. The calcogenide may include germanium (Ge), antimony (Sb) and tellurium (Te). The calcogenide can also include dopants such as silicon (Si), aluminum (Al), titanium (Ti), carbon (C), or any combination thereof.

A conductive layer 400 including metal is then formed on the phase changeable layer 300. The conductive layer 400 may be formed using metal, metal nitride or combination thereof. For example, the conductive layer 400 may be formed using tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, copper, aluminum copper, alloys thereof, or any combination thereof.

The conductive layer 400 may be formed by a sputtering process, a chemical vapor deposition (CVD) process, an electron bean deposition process, an atomic layer deposition (ALD) process or a pulse laser deposition (PLD) process.

A mask pattern 500 is then formed on the conductive layer 400. The mask pattern 500 may include material having an etching selectively with respect to the conductive layer 400 and the phase changeable layer 300.

Referring to FIGS. 3 and 4, the conductive layer 400 and the phase changeable layer 300 can be successively etched using the mask pattern 500 as an etch mask. Particularly, the conductive layer 400 and the phase changeable layer 300 are etched using a first material including a chlorine-containing compound and a fluorine-containing compound. Thus, the conductive layer 400 and the phase changeable layer 300 are transformed into an upper electrode 410 and a phase changeable pattern 310, respectively. The mask pattern 500 is then removed.

The chlorine-containing compound may be chlorine (Cl2) or boron trichloride (BCl3). The fluorine-containing compound may be tetraflouromethane (CF4), trifluoromethane (CHF3), difluoromethane (CH2F2), monofluoromethane (CH3F). These may be used alone or in a combination thereof.

The first material may further include a diluent. The diluent can be selected from the group consisting of helium (He), neon (Ne), argon (Ar), krypton (Kr), xenon (Xe) or radon (Rn). These may be used alone or in a combination thereof. It is preferred to have the first material in a plasma state.

After the etching step, a second material including an oxygen-containing compound (e.g., oxygen (O2) plasma or water vapor (H2O) plasma or both) can be provided to the upper electrode 410 and the phase changeable pattern 310. When the second material is provided to the upper electrode 410 and the phase changeable pattern 310, it is believed that chlorine, fluorine and carbon residing on a sidewall of the phase changeable pattern 310 and between the upper electrode 410 and the phase changeable pattern 310 may be removed. Here, the second material may be provided to the upper electrode 410 and the phase changeable pattern 310 in-situ.

Particularly, chlorine residing on a sidewall of the phase changeable pattern 310 and between the upper electrode 410 and the phase changeable pattern 310 may be converted into the following reaction products: chlorine dioxide (ClO2), dichlorine monoxide (Cl2O), dichlorine heptoxide (Cl2O7), hydrogen chloride (HCl) and the like. The boiling points of chlorine dioxide, dichlorine monoxide, dichlorine heptoxide and hydrogen chloride are about −76° C., about −121° C., about −91° C. and about −114° C., respectively. Because the boiling points of these chlorine-based reaction products are relatively low, they may be removed via diffusion or convection from the sidewall of the phase changeable pattern 310 and an interface between the upper electrode 410 and the phase changeable pattern 310.

Similarly, fluorine residing on the sidewall of the phase changeable pattern 310 and between the upper electrode 410 and the phase changeable pattern 310 may be converted into the following reaction products: carbonyl fluoride (CF2O), hydrogen fluoride (HF) and the like. Boiling points of carbonyl fluoride and hydrogen fluoride are about −83.1° C. and about −83.5° C., respectively. Because the boiling points of these fluorine-based reaction products are relatively low, they may also be removed via diffusion or convection from the sidewall of the phase changeable pattern 310 and the interface between the upper electrode 410 and the phase changeable pattern 310.

Likewise, carbon residing on the sidewall of the phase changeable pattern 310 and between the upper electrode 410 and the phase changeable pattern 310 may be converted into the following reaction products: carbonyl fluoride, carbon monoxide (CO), carbon dioxide (CO2), carbon dioxide and the like. Boiling points of carbonyl fluoride, carbon monoxide and carbon dioxide are about −83.1° C., about −191.5° C. and about −78° C., respectively. Because the boiling points of these carbon-based reaction products are relatively low, they may also be removed via diffusion or convection from the sidewall of the phase changeable pattern 310 and the interface between the upper electrode 410 and the phase changeable pattern 310.

It is preferred to provide the second material at a sufficient temperature and pressure and for a sufficient duration to maximize the formation of the reaction products of the chlorine, fluorine, carbon, or any combination thereof with the second material.

For example, it is preferred to provide the second material into the chamber at a temperature from about 40° C. to about 150° C. At a temperature lower than about 40° C., it is believed that the chlorine, fluorine and carbon (e.g., residing on the sidewall of the phase changeable pattern 310 and between the upper electrode 410 and the phase changeable pattern 310) may not sufficiently react with the second material and be removed. On the other hand, if the temperature is higher than about 150° C., the upper electrode 410 and the phase changeable pattern 310 may be thermally damaged.

Similarly, it is preferred to provide the second material for a duration from about 80 seconds to about 100 seconds at the above specified temperature ranges. When the reaction duration is less than about 80 seconds at the above specified temperature ranges, it is believed that chlorine, fluorine and carbon (e.g., residing on the sidewall of the phase changeable pattern 310 and between the upper electrode 410 and the phase changeable pattern 310) may not sufficiently react with the second material and be removed. On the other hand, when the reaction duration is greater than about 100 seconds at the above specified temperature ranges, the upper electrode 410 and the phase changeable pattern 310 may be thermally damaged. For example, the second material can be provided to the upper electrode 410 and the phase changeable pattern 310 for about 90 seconds.

In accordance with the present invention, chlorine, fluorine and carbon may be removed from the sidewall of the phase changeable pattern 310 and the interface between the upper electrode 410 and the phase changeable pattern 310. Thus, defects due to chlorine, fluorine and carbon (e.g., residing on the sidewall of the phase changeable pattern 310 and between the upper electrode 410 and the phase changeable pattern 310) that may be generated in succeeding processes are decreased.

Experiment

A hole is formed in an insulating layer, which includes silicon nitride. A titanium nitride lower electrode is then formed in the hole. Here, an upper face of the insulating layer is substantially coplanar with an upper face of the lower electrode.

A phase changeable layer is then formed on the insulating layer and the lower electrode. The phase changeable layer includes germanium, antimony and tellurium. Here, atomic percentages of germanium, antimony and tellurium are about 24.8%, about 24.5% and about 50.6%, respectively.

A titanium nitride layer is then formed on the phase changeable layer. The titanium nitride layer and phase changeable layer are successively etched to form an upper electrode and a phase changeable pattern, respectively. The titanium nitride layer and the phase changeable layer are successively etched using a first material including chlorine, tetraflouromethane, and argon, as a diluent. The first material has a plasma state.

A second material including oxygen plasma and water vapor plasma is then provided to the upper electrode and the phase changeable pattern. Here, the second material is provided to the upper electrode and the phase changeable pattern in-situ, i.e., in the same chamber.

The second material is provided while maintaining the chamber at a temperature of about 100° C. Furthermore, the second material was provided in the chamber for about 90 seconds.

The phase changeable structure obtained from the method above exhibit a reduced number of defects at an upper face portion of the phase changeable pattern making contact with the upper electrode, at a side face portion of the phase changeable pattern, at a lower face portion of the phase changeable pattern making contact with the insulating layer.

Figure 5:
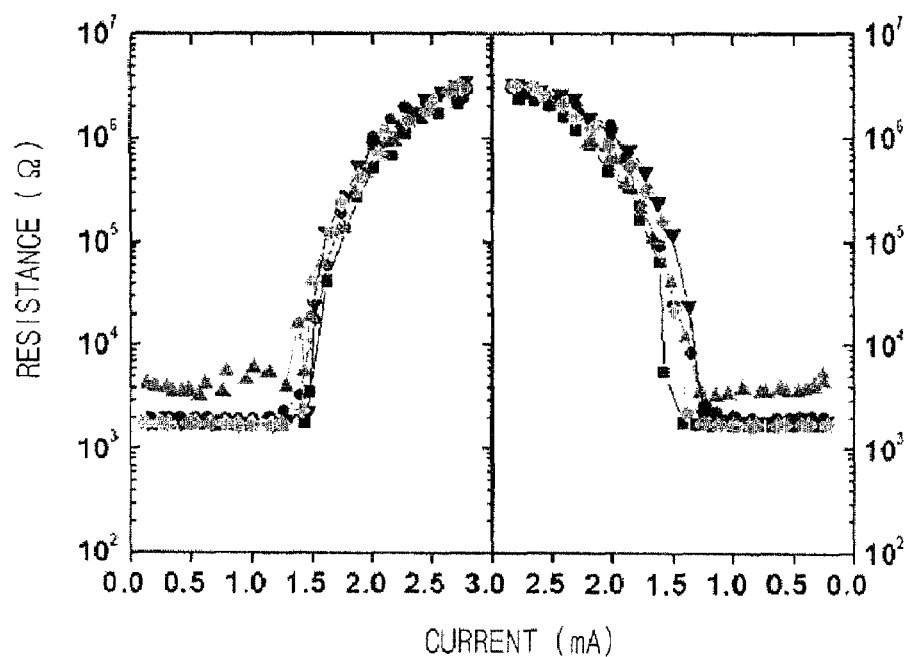
FIG. 5 is a graph showing electric resistance in relation to current of a phase changeable pattern formed by using the methods of one embodiment of the present invention.

FIG. 5 is a graph showing electric resistance with respect to current of a phase changeable structure formed according to the above-described method.

Referring to FIG. 5, when the current provided to the phase changeable pattern is less than about 1.5 mA, the phase changeable pattern may be in a single crystalline state having a relatively low electric resistance. On the other hand, when the current provided to the phase changeable pattern is greater than about 1.5 mA, the phase changeable pattern is in the amorphous state having a relatively low electric resistance.

Embodiment 2

Figure 6:
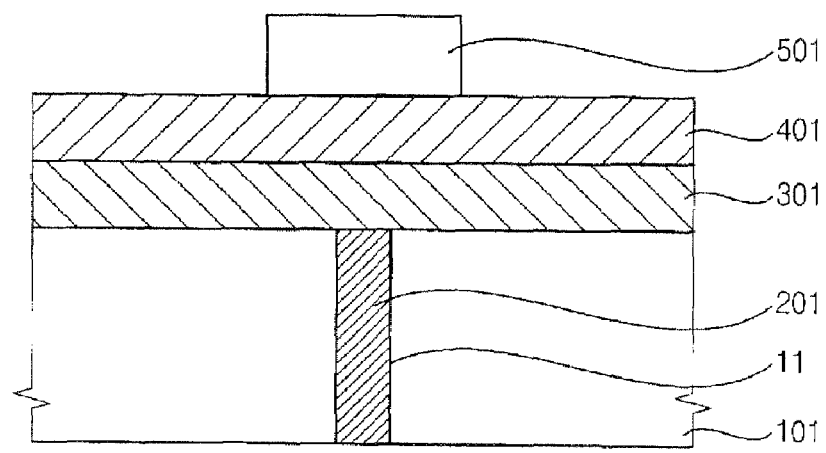
FIGS. 6 to 8 are cross-sectional views illustrating a method of forming a phase changeable structure in accordance with a second embodiment of the present invention.
Figure 7:
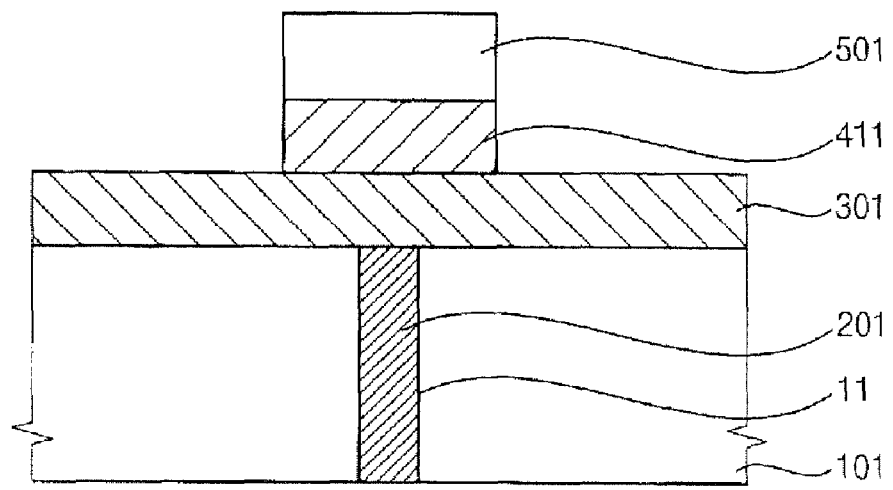
Figure 8:
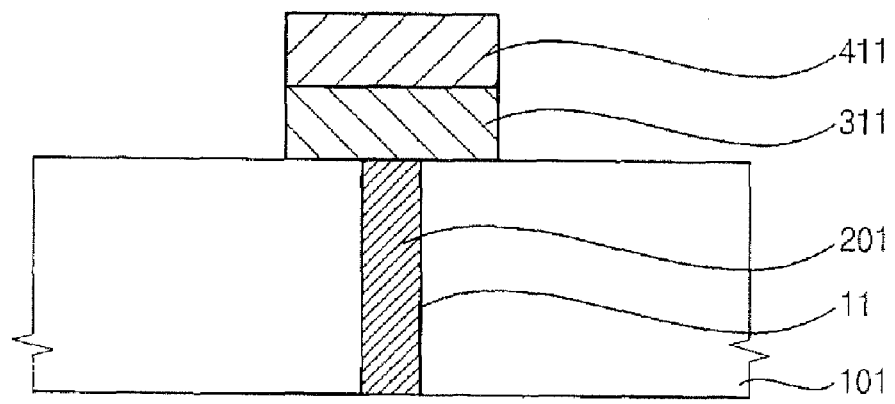

FIGS. 6 to 8 are cross-sectional views illustrating a method of forming a phase changeable structure in accordance with a second embodiment of the present invention.

Referring to FIG. 6, a hole 11 is formed in an insulating layer 101. The insulating layer 101 may be formed using oxide or nitride. For example, the insulating layer 101 may be formed using PSG, BPSG, USG, SOG, TEOS, PE-TEOS, FOX, HDP-CVD oxide or silicon nitride.

A lower electrode 201 is then formed in the hole 11. The lower electrode 201 may be formed using metal, metal nitride or combination thereof. For example, the lower electrode 201 may be formed using tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, copper, aluminum copper, alloys thereof, or combination thereof. Alternatively, the lower electrode 201 may include polysilicon doped with impurities. Here, an upper face of the insulating layer 101 may be substantially coplanar with an upper face of the lower electrode 201.

A phase changeable layer 301 is then formed on the insulating layer 101 and the lower electrode 201. The phase changeable layer 301 may include calcogenide. The calcogenide may include germanium, antimony and tellurium. The calcogenide can also include dopants such as silicon (Si), aluminum (Al), titanium (Ti), carbon (C), or any combination thereof.

A conductive layer 401 including metal is then formed on the phase changeable layer 301. The conductive layer 401 may be formed using metal, metal nitride or combination thereof. For example, the conductive layer 401 may be formed using tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, copper, aluminum copper, alloys thereof, or combination thereof.

The conductive layer 401 may be formed by a sputtering process, a chemical vapor deposition process, an electron bean deposition process, an atomic layer deposition process or a pulse laser deposition process.

A mask pattern 501 is then formed on the conductive layer 401. The mask pattern 501 may include material having an etching selectivity with respect to the conductive layer 401 and the phase changeable layer 301.

Referring to FIGS. 6 and 7, a first etching process is performed on the conductive layer 401 by using the mask pattern 501 as an etch mask. Thus, the conductive layer 401 may be transformed into an upper electrode 411. The first etching process is performed using a first material including a chlorine-containing compound. Nonlimiting examples of chlorine-containing compounds include chlorine (Cl2) and boron trichloride (BCl3).

Although not illustrated in FIG. 7, a portion of the phase changeable layer 301 can be partially removed by the first etching process. Since the etch rate of the first material with respect to the phase changeable layer 301 can be substantially larger than the etch rate of the first material with respect to the conductive layer, it may be difficult to stop the etching process exactly at the beginning of the phase changeable layer 301.

A curing process can then be performed on the upper electrode 411 and the phase changeable layer 301 in a chamber having a source electrode and a bias electrode. A second material including a fluorine-containing compound can be provided to the upper electrode 411 and the phase changeable layer 301 in the curing process. Nonlimiting examples of the fluorine-containing compound include tetraflouromethane, trifluoromethane, difluoromethane or monofluoromethane. These may be used alone or in a combination thereof. The curing process may be performed in-situ.

The second material may further include a diluent. The diluent may be helium, neon, argon, krypton, xenon or radon. These may be used alone or in a combination thereof. It is preferred to have the second material in a plasma state.

When the curing process is performed on the upper electrode 411 and the phase changeable layer 301, it is believed that defects due to chlorine existing on the phase changeable layer and between the upper electrode 411 and the phase changeable layer 301 may be decreased.

The bias electrode can be installed at a chuck located at a lower portion of the chamber. The chuck typically supports the upper electrode 411 and the phase changeable layer 301. The source electrode can be located at an upper portion of the chamber. Here, the source electrode and the bias electrode can be utilized to change a state of the second material into the plasma state.

Particularly, a first electric power and a second electric power can be applied to the source electrode and the bias electrode, respectively. When a ratio of the first electric power to the second electric power is less than about 2.5:1, it is believed that the efficiency of the curing process can be low. On the other hand, when the ratio of the first electric power to the second electric power is greater than about 10:1, it can be difficult to control the curing process effectively. Thus, it is preferred to have the ratio of the first electric power to the second electric power at a ratio of about 2.5:1 to about 10:1. It is more preferable to have the ratio of the first electric power to the second electric power at about 5:1. That is, the first electric power and the second electric power are about 1,000 Watt and about 200 Watt, respectively.

When a pressure of the chamber is less than about 1 mTorr, it is believed that the efficiency of the curing process is low. On the other hand, when the pressure of the chamber is greater than about 10 mTorr, it can be difficult to control the first etching process effectively. Thus, it is preferred to maintain the pressure of the chamber at about 1 mTorr to about 10 mTorr. It is more preferable to maintain the pressure of the chamber at about 5 mTorr.

When a flow ratio of the first component with respect to the second component is less than about 1:4, it is believed that undesirable byproducts, such as metal fluoride, may be generated. On the other hand, when the flow ratio of the first component with respect to the second component is greater than about 3:2, the efficiency of the curing process can be low. Thus, it is preferred to have the flow ratio of the first component with respect to the second component at about 1:4 to about 3:2. It is more preferred to have the flow ratio of the first component with respect to the second component at about 2:3.

When the curing process is performed for less than about 5 seconds, it is believed that the efficiency of the curing process may be degraded. On the other hand, when the curing process is performed for more than about 15 seconds, the second material may partially remove the upper electrode 411 and the phase changeable layer 301. Thus, it is preferred to conduct the curing process for about 5 seconds to about 15 seconds. For example, the curing process may be performed for about 10 seconds.

Referring to FIG. 8, a second etching process is performed on the phase changeable layer 301 by using a third material that is substantially free of chlorine. Nonlimiting examples of etchants that are substantially free of chlorine include hydrogen bromide (HBr), argon (Ar), helium (He), neon (Ne), xenon (Xe), and any combination thereof. Thus, a phase changeable pattern 311 may be formed between the upper electrode 411 and the lower electrode 201. The mask pattern 501 is then removed.

When the third material includes chlorine, it is believed that chlorine may be chemically reacted with the phase changeable layer 301 to generate defects. Particularly, the defects may be generated at a side face portion of the phase changeable pattern 311.

Particularly, when the phase changeable layer 301 includes germanium, antimony and tellurium, a chemical reaction between chlorine and antimony may occur. Thus, atomic percentages of antimony may decrease. As a result, it is desirable that the second material does not include chlorine.

According to the present embodiment, the curing process is performed after the conductive layer 411 is etched and before the phase changeable layer 301 is etched. Thus, the defects due to chlorine residing on the sidewall of the phase changeable pattern 301 and between the upper electrode 411 and the phase changeable pattern 301 may be prevented.

According to the present invention, the reduced number of defects may be generated at a side face of a phase changeable pattern and between an upper electrode and the phase changeable pattern.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming a phase changeable structure, the method comprising:
    forming a phase changeable layer on a lower electrode;
    forming a conductive layer on the phase changeable layer;
    etching at least a portion of the conductive layer with a first material having a chlorine-containing compound to form an upper electrode;
    exposing the upper electrode and the phase changeable layer to a second material having a fluorine-containing compound; and
    etching the phase changeable layer with a third material that is substantially free of chlorine to form a phase changeable pattern, in which the third material is different from the second material.

2. The method according to claim 1, further comprising removing substantially all of the first material before the exposing step.

3. The method of claim 1, wherein the fluorine-containing compound is selected from the group consisting of tetrafluoromethane, trifluoromethane, difluoromethane, monofluoromethane, and any combination thereof.

4. The method of claim 1, wherein the second material further includes a diluent in a plasma state.

5. The method of claim 4, wherein the diluent is selected from the group consisting of helium, neon, argon, krypton, xenon, radon, and any combination thereof.

6. The method of claim 1, wherein the phase changeable layer comprises a calcogenide selected from the group consisting of germanium, antimony, tellurium, and any combination thereof.

7. The method of claim 1, wherein the fluorine-containing compound is selected from the group consisting of tetrafluoromethane, trifluoromethane, difluoromethane, monofluoromethane, and any combination thereof.

8. The method of claim 1, wherein the conductive layer comprises a metal selected from the group consisting of tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, copper, aluminum copper, alloys thereof, and any combination thereof.

9. The method of claim 1, wherein the exposing step is performed for about 5 seconds to about 15 seconds.

10. The method of claim 4, wherein the exposing step is performed in a chamber having a source electrode and a bias electrode, wherein power is applied at a ratio from about 2.5:1 to about 10:1 to the source electrode and the bias electrode, respectively, the chamber is maintained at a pressure from about 1 mTorr to about 10 mTorr, and a flow ratio from about 1:4 to about 3:2 of the fluorine-containing compound with respect to the diluent.

11. The method of claim 1, in which etching the phase changeable layer with the third material and exposing the upper electrode and the phase changeable layer to the second material are separate processes that are not performed concurrently.

12. The method of claim 1, in which the third material is different from the second material in that the third material is physically separate and distinct from the second material.

* * * * *